United States Patent [19]

Dupre et al.

[11] Patent Number: 5,214,566
[45] Date of Patent: May 25, 1993

[54] REINFORCED I.C. CARD

[75] Inventors: François Dupre, Aubagne; Jean-Pierre Gloton, Aix En Provence, both of France

[73] Assignee: Gemplus Card International, Gemenos, France

[21] Appl. No.: 723,615

[22] Filed: Jul. 1, 1991

[30] Foreign Application Priority Data

Jul. 10, 1990 [FR] France .................. 90 08734

[51] Int. Cl.⁵ .................. G06K 19/06; B32B 3/00
[52] U.S. Cl. .................. 361/392; 361/380; 174/35 R; 428/902
[58] Field of Search .......... 361/380, 392; 174/35 R, 174/35 MS; 428/902, 402

[56] References Cited

U.S. PATENT DOCUMENTS

| | | | |
|---|---|---|---|
| 4,786,541 | 11/1988 | Nishimura et al. | 428/902 |
| 4,879,153 | 11/1989 | Ohashi et al. | 235/492 |
| 4,908,937 | 3/1990 | Gloton et al. | 29/840 |
| 4,941,257 | 7/1990 | Gloton | 29/840 |
| 4,943,464 | 7/1990 | Gloton et al. | 428/76 |
| 4,990,759 | 2/1991 | Gloton et al. | 235/492 |

FOREIGN PATENT DOCUMENTS 0071255 7/1982 European Pat. Off. .
0211360 7/1986 European Pat. Off. .

OTHER PUBLICATIONS

Patent Absracts of Japan, vol. 10, No. 338 (P-516)[2394], 15 Nov. 1986; & JP-A-61 141089.

Primary Examiner—Davis L. Willis
Assistant Examiner—Esther H. Chin
Attorney, Agent, or Firm—Pollock, VandeSande & Priddy

[57] ABSTRACT

To provide I.C. cards that are reinforced and above all in which the card body is compatible both with using the I.C. in the card and with using a surface of the card that is coated with a film of magnetic material, at least two reinforcing sheets made of different types of reinforcing material are provided so as to adapt the expansion coefficient and the strength coefficient of the card so that both these coefficients lie within a range that is common to both card technologies. It is shown that this provides greater synergy in use of cards having both electronic memory and magnetic memory since in spite of temperature expansion magnetic card shapes are maintained, thereby making it possible to use magnetic tracks that comply with mass data storage requirements for use with magnetic tracks.

2 Claims, 2 Drawing Sheets

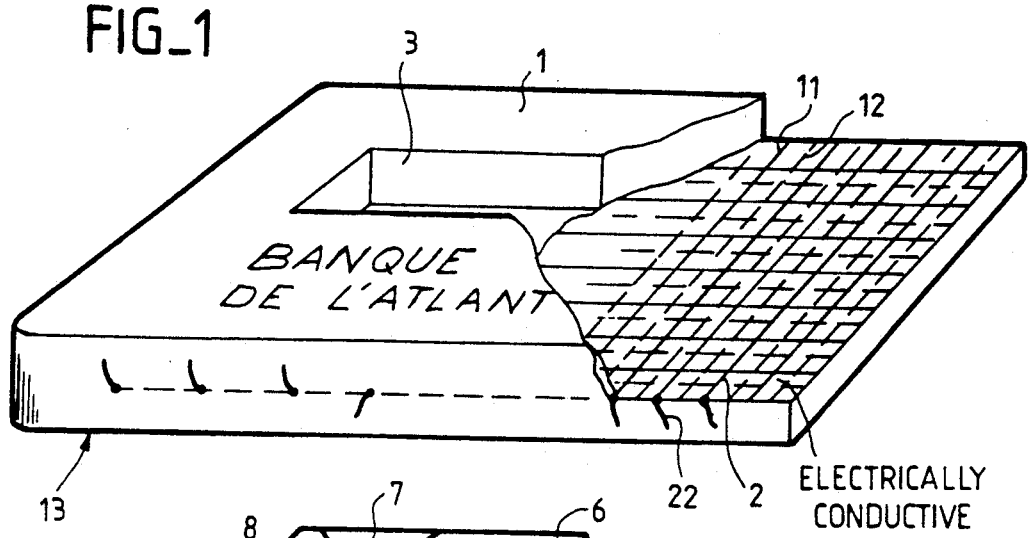
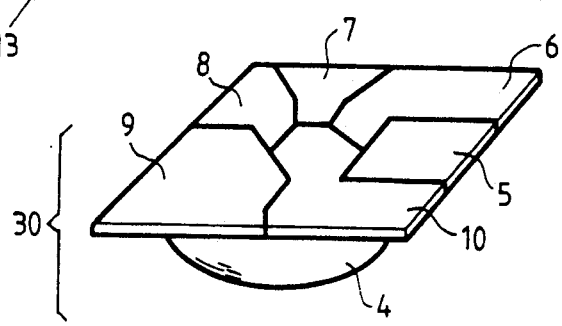
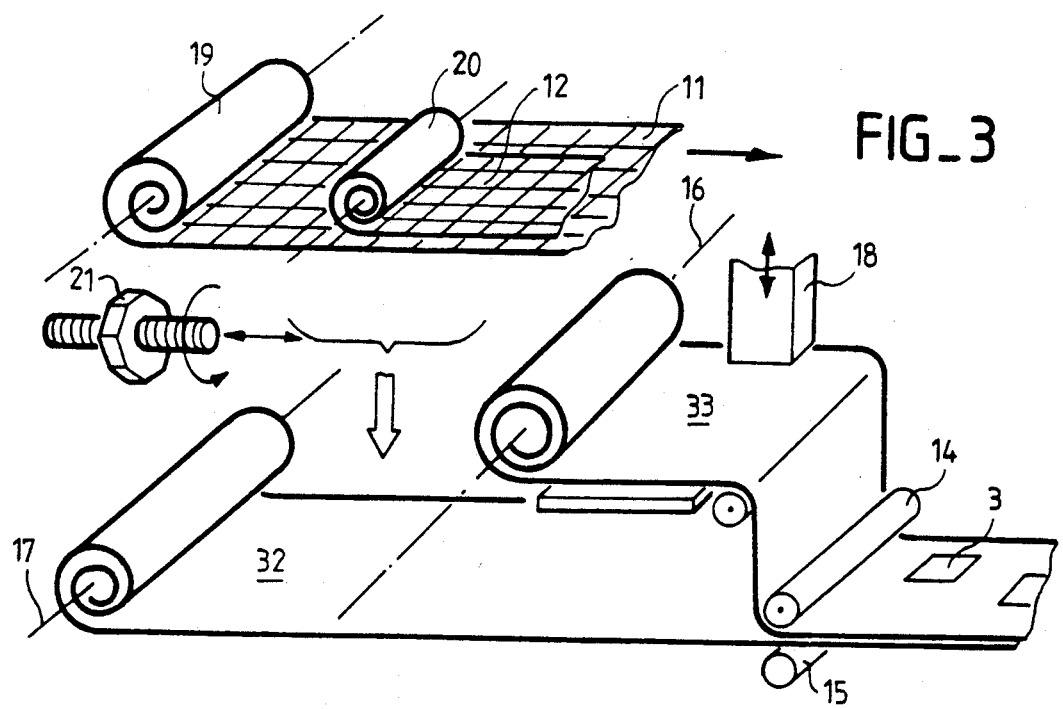

FIG_4
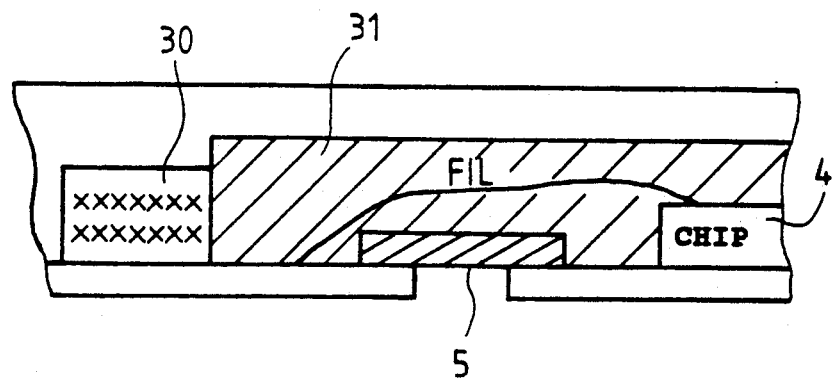

REINFORCED I.C. CARD

FIELD OF THE INVENTION

The present invention relates to a reinforced integrated circuit card, I.C. card, i.e. a card whose body is better able to withstand the external mechanical stresses applied thereto while being handled by its user. Another main object present invention is to make the technology of I.C. cards more compatible with that of magnetic track cards, in order to improve the performance of these two technologies in combination.

BACKGROUND OF THE INVENTION

I.C. cards are known that are usable in banking and also for prepayment purposes: e.g. prepayment of a telephone call, prepayment of parking time for a vehicle, etc. Such I.C. cards normally include a card body made of plastic in which a cavity is formed, which cavity receives an electronics micromodule provided with contact metallization for providing electrical communication between the micromodule and the outside world. I.C. cards have also been envisaged in which the micromodule is not provided with contact metallization. In such applications, communication with the card takes place by radio.

One of the problems encountered with I.C. cards is their mechanical strength. To this end, in order to be acceptable for use by the general public, cards must be capable of passing severe stress testing. During such testing which simulates situations that may arise in use, a card is curved some number of times perpendicularly to its long axis or to its short axis. A card is considered as passing such a test if the micromodule has not become detached after a series of curving operations has been completed, and/or if the stresses have not been transferred to the micromodule sufficiently to break it. Other tests relate to the bending strength of card bodies. In such tests, manufactured cards are required to withstand as high a bending force as possible. Beneath a given bending force card bodies are rejected, above it they are accepted.

For the reasons mentioned above, card bodies have thus been reinforced, either overall or else in the proximity of the region in a card body having the cavity which receives the micromodule. For example, European patent application number 0 071 255 published on Feb. 9, 1983 describes I.C. card media in which the plastic material used for the card body medium is reinforced with glass fibers. In such a configuration, during co-lamination of the layers of the card body, use is made of a co-lamination core constituted by epoxy resin reinforced with glass fibers.

In magnetic track card applications, the back of a card is covered with a magnetic track in which information is recorded. A reader can receive such cards and decode the information recorded thereon for the purpose of identifying the card bearer. Normally the density of information actually stored on such tracks is low so as to provide tolerance to large variations in use. The difference between magnetic track cards and I.C. cards comes from the fact that the quantity of information that can be stored with magnetic tracks is greater than the quantity that can be stored with electronic micro modules, but that access to the information is slower with magnetic tracks than it is with micromodules. In contrast, from the security point of view, magnetic track cards provide no security guarantee at all. Very rudimentary equipment is all that is required for duplicating the information from such cards to cards made unprofessionally, thereby enabling cards to be used in ways that were not intended when they were issued. There also exist combined cards having both electronic and magnetic memory. The purpose is to make best use of the performance available from each of the two types of memory media. At present, practical use of such cards is prevented by problems associated with different tolerances in use.

It has also been observed that problems of dimensional stability occur because of the range of temperatures to which cards are subjected in use. Dual memory type cards, in particular, can only be made both long-lasting and highly reliable if they are simultaneously of great dimensional stability and also of considerable mechanical stiffness. In addition, making the card body of plastic gives rise to considerable electrostatic discharge phenomena which are injurious both to an electronic micromodule and to a magnetic track.

An object of the invention is to remedy the above-mentioned drawbacks by proposing a technique for reinforcing cards that leads to such mechanical stability independently of temperature and which adapts itself to the mechanical and/or thermal expansion behavior of the micromodule or of the magnetic track. Thermal expansion can change a magnetic track to such an extent that the resulting format thereon no longer lies within the standards laid down. In order to adapt the deformation effects so as to keep them within a range of tolerances that is compatible with both of the technologies and regardless of temperature, the card body is reinforced in accordance with the invention by using at least two sheets of different strengthening materials. Each of these sheets is organized in a matrix configuration and the two matrix configurations are preferably intermeshed, e.g. by offsetting one of the sheets by half a pitch relative to the other. It is then observed that the card body made of plastic itself absorbs the differential forces due to the two different materials, and instead of this leading to the card breaking up, it leads on the contrary to tolerances being satisfied accurately.

SUMMARY OF THE INVENTION

The present invention thus provides an I.C. card comprising a card body made of plastic whose stiffness is reinforced by strengthening fibers, the card body also being provided with a cavity for receiving an integrated circuit chip provided with means for establishing communication between the chip circuit and the world outside the card, wherein the strengthening fibers are, at least locally, of two different types and are placed in the card body in at least two sheets in two matrix configurations.

BRIEF DESCRIPTION OF THE DRAWINGS

An embodiment of the invention is described by way of example with reference to the accompanying drawings, in which:

FIG. 1 is a diagram of a reinforced I.C. card of the invention;

FIG. 2 shows an electronic micromodule suitable for insertion in the card body of FIG. 1;

FIG. 3 shows one example of how a card body of the invention may be manufactured by using a co-lamination method; and FIG. 4 is a section through an embodiment of an application of the invention using a micromodule belt.

DETAILED DESCRIPTION

FIG. 1 shows an I.C. card body of the invention. The card body is made of plastic, e.g. PVC or ABS, and its stiffness is reinforced by strengthening fibers 2. The card body further includes a cavity 3 for receiving an integrated circuit (I.C.) chip 4 as shown in FIG. 2. The electronic chip 4 is contained in a micromodule 3 provided on its surface with metal tabs such as 5 to 10 which are connected to the chip and which are intended to enable electrical communication to be established between the circuit 4 and the world outside the card. The special feature of the invention lies in the fact that the strengthening fibers 2 comprise at least two sheets: a sheet 11 shown in continuous lines, and a sheet 12 shown in dashed lines. The two sheets are made of materials of different types. In one example, the sheet 11 is a sheet of carbon graphite while the sheet 12 is a sheet of boron fiber Both of these sheets and 12 are made to have matrix configurations. In the example shown, the matrix configurations are simple configurations comprising perpendicular rows and columns with the inter-row pitch being equal to the inter-column pitch. The two matrix configurations 11 and 12 are intermeshed in each other, preferably by being offset by half of the pitch. In one embodiment, the fibers in these two sheets are at a spacing of about 1 millimeter (mm). The diameter of the fibers is then about 0.05 mm.

The intermeshing of the sheets is not a necessary condition for enabling card body expansion to adapt to the constraints of the two technologies. However, in preferred manner, this intermeshing improves the transfer of the reinforcing forces produced by the fibers to the body of the card.

As mentioned above, a card made in this way is preferably a card having both magnetic and electronic memory. Thus, it includes a magnetic track on one of its faces 13 (the face that is not shown in FIG. 1) and occupying all or a portion of the back of the card.

FIG. 3 shows a co-lamination type manufacturing method. The bottom of the figure shows the conventional manufacturing method prior to the reinforcement of the invention which is represented by the top of the figure and by the outline arrow. For co-lamination, rotary presses 14 and 15 superpose layers of plastic that are presented flat after being paid out from reels 16 and 17. A stack of two layers is shown, but in practice a larger number may be used. Above the top layer, a machine 18 is shown diagrammatically for the purpose of punching holes in the top layer to constitute card-receiving cavities 3. In the invention, at least two reinforcing sheets (respectively 11 and 12) are co-laminated in an intermediate position in the card body. For example, this means that the sheets 11 and 12 wound on respective reels 19 and 20 engage in the co-lamination method after layers 32 and 33. Each of the two sheets 11 and 12 may be supported by natural gluing on a very fine film. So as to adjust the half-pitch offset between the matrix configurations of the two sheets, means are provided (represented in this case by a micrometer screw 21) for offsetting the axes of the reels 19 and 20 relative to each other.

In an improvement, one of the two sheets, e.g. the sheet 11, is wider than the sheet 12 and is even wider than the layers used in co-laminating the card bodies. In this way, the sheet 11 presents fringes 22 that project from the edges of the cards (as visible in FIG. 1). The sheet 11 is then preferably made of a material that conducts electricity, and preferably of graphite. Under these conditions by rubbing against the edges of insertion slots in I.C. card readers that subsequently receive the cards, these fringes serve to establish an equipotential electrical surface within the body of the card itself, and above all to greatly simplify evacuating any charge that may accumulate during such electrostatic discharges as may occur. To this end, the graphite of the sheet 11 could even be replaced by a configuration of metal wires, e.g. wires made of copper or of aluminum.

With different types of reinforcing materials, the expansion and the strength coefficients are adapted so that these coefficients lie in a range which is common to both card technologies: i.e. to magnetic cards and to electronic cards. To improve this adaptation, the following may be performed: either the shape of one of the matrix configuration is altered, or the strength of a sheet is increased by changing the fiber material or the fiber diameter, or else a third sheet is used. In addition, the reinforcing forces can be limited locally within the card by extending the reinforcing configuration or network only over portions of the film carrying it, at least for one of the two sheets. On co-lamination, these localized reinforcing regions are placed close to the cavity.

Thus, instead of treating the entire card body, the reinforcing action may be limited to a mechanical belt 30 formed around the micromodule 31: see FIG. 4. This belt is preferably fixed to the micromodule before the micromodule together with the belt is fixed in the card. With composite boron-carbon reinforcement as mentioned above, this has shown that it is possible to control the mechanical stresses that are transmitted to the micromodule per se when bending takes place. The micromodule together with its belt is then not too rigid as would be the case using fiber reinforcement made of a single, too hard type material. Consequently, the micromodule and its belt do not become detached during bending tests. However, the reinforcement is strong enough to protect the micromodule itself. This reinforcement is stronger than that which can be obtained using fibers of a single, too-soft type.

In the invention, by controlling stiffnesses by an appropriate selection of composite materials, the number of cards that pass bending tests is increased.

We claim:

1. An I.C. card comprising a card body made of plastic whose stiffness is reinforced by strengthening fibers, the card body also being provided with a cavity for receiving an integrated circuit chip provided with means for establishing communication between the chip circuit and the world outside the card, wherein the strengthening fibers are, at least locally, of two different types and are placed in the car body in at least two sheets and in two matrix configurations, wherein the two configurations are intermeshed.

2. An I.C. card comprising a card body made of plastic whose stiffness is reinforced by strengthening fibers, the card body also being provided with a cavity for receiving an integrated circuit chip provided with means for establishing communication between the chip circuit and the world outside the card, wherein the strengthening fibers are, at least locally, of two different types and are placed in the card body in at least two sheets and in two matrix configurations, wherein the two strengthening sheets are disposed in a belt fixed around the micromodule including the chip prior to the micromodule and its belt being fixed in the car body.

* * * * *

UNITED STATES PATENT AND TRADEMARK OFFICE
CERTIFICATE OF CORRECTION

PATENT NO. : 5,214,566

DATED : May 25, 1993

INVENTOR(S) : Francoise Dupre et al.

It is certified that error appears in the above-identified patent and that said Letters Patent is hereby corrected as shown below:

Column 1, line 9, after "object" insert --of the--.

Column 3, line 21, after "fiber" insert --.--.

Column 3, line 21, after "sheets" insert --11--.

Column 4, line 53, change "car" to --card--.

Column 4, line 67, change "car" to --card--.

Signed and Sealed this

Fifteenth Day of February, 1994

Attest:

BRUCE LEHMAN

Attesting Officer

Commissioner of Patents and Trademarks